United States Patent
Lee (10) Patent No.: US 12,354,660 B2
(45) Date of Patent: Jul. 8, 2025

(54) SEMICONDUCTOR DEVICES

(71) Applicant: WUHAN XINXIN SEMICONDUCTOR MANUFACTURING CO., LTD., Hubei (CN)

(72) Inventor: Eunseok Lee, Hubei (CN)

(73) Assignee: WUHAN XINXIN SEMICONDUCTOR MANUFACTURING CO., LTD., Wuhan (CN)

(*) Notice: Subject to any disclaimer, the term of this patent is extended or adjusted under 35 U.S.C. 154(b) by 267 days.

(21) Appl. No.: 18/315,703

(22) Filed: May 11, 2023

(65) Prior Publication Data

US 2023/0282284 A1  Sep. 7, 2023

Related U.S. Application Data

(63) Continuation of application No. PCT/CN2020/140098, filed on Dec. 28, 2020.

(30) Foreign Application Priority Data

Nov. 13, 2020 (CN) .......................... 202011316312.5

(51) Int. Cl.
*G11C 16/04* (2006.01)
*H01L 23/522* (2006.01)
(Continued)

(52) U.S. Cl.
CPC ...... *G11C 16/0483* (2013.01); *H01L 23/5226* (2013.01); *H01L 23/5283* (2013.01);
(Continued)

(58) Field of Classification Search
CPC ..... G11C 16/0483; G11C 16/08; G11C 16/24; H01L 23/5226; H01L 23/5283;
(Continued)

(56) References Cited

U.S. PATENT DOCUMENTS

| 6,262,914 B1 | 7/2001 | Smayling |
| 7,952,946 B2 | 5/2011 | Kengeri |

(Continued)

FOREIGN PATENT DOCUMENTS

| CN | 1921013 A | 2/2007 |
| CN | 101447225 A | 6/2009 |

(Continued)

OTHER PUBLICATIONS

Chinese Search Report in application No. 202011316312.5, mailed on Sep. 4, 2023.

(Continued)

*Primary Examiner* — Tha-O H Bui
(74) *Attorney, Agent, or Firm* — Nathan & Associates Patent Agents Ltd.; Menachem Nathan (57) ABSTRACT

A semiconductor device includes a memory array structure and a peripheral structure. The memory array structure includes a plurality of memory strings, a plurality of local bit lines, and a plurality of global bit lines. The peripheral structure includes a plurality of local bit line selectors and one or more global bit line selectors. Each of the local bit lines is connected with at least one of the memory strings. Each of the local bit line selectors has an output terminal connected with ones of the local bit lines respectively through first through holes, and an input terminal connected with one of the global bit lines through a second through hole. Each of the global bit line selectors has an output terminal connected with ones of the global bit lines respectively through third through holes.

20 Claims, 5 Drawing Sheets

(51) Int. Cl.
*H01L 23/528* (2006.01)
*H10B 41/20* (2023.01)
*H10B 41/40* (2023.01)
*H10B 43/20* (2023.01)
*H10B 43/40* (2023.01)

(52) U.S. Cl.
CPC .............. *H10B 41/20* (2023.02); *H10B 41/40* (2023.02); *H10B 43/20* (2023.02); *H10B 43/40* (2023.02)

(58) Field of Classification Search
CPC ........ H10B 41/20; H10B 41/40; H10B 43/20; H10B 43/40; H10B 43/27
USPC .................................................... 365/185.17
See application file for complete search history.

(56) References Cited

U.S. PATENT DOCUMENTS

| | | |
|---|---|---|
| 8,233,330 B2 | 7/2012 | Wu |
| 2004/0076072 A1 | 4/2004 | Arigane et al. |
| 2007/0034908 A1 | 2/2007 | Cho et al. |
| 2011/0297912 A1 | 12/2011 | Samachisa et al. |
| 2011/0299314 A1 | 12/2011 | Samachisa et al. |
| 2011/0299328 A1 | 12/2011 | Liu |
| 2013/0003435 A1 | 1/2013 | Liu |
| 2013/0294132 A1 | 11/2013 | Liu |
| 2014/0043911 A1 | 2/2014 | Samachisa et al. |
| 2014/0192596 A1* | 7/2014 | Rhie .................. G11C 16/0483 365/185.05 |
| 2015/0069568 A1* | 3/2015 | Yamane .................. H10B 43/50 257/499 |
| 2016/0141337 A1 | 5/2016 | Shimabukuro |
| 2016/0314833 A1 | 10/2016 | Lee |
| 2016/0336046 A1 | 11/2016 | Liu |
| 2017/0301733 A1 | 10/2017 | Liu |
| 2018/0120405 A1 | 5/2018 | Liu |
| 2018/0275239 A1 | 9/2018 | Liu |
| 2019/0178969 A1 | 6/2019 | Liu |
| 2020/0249307 A1 | 8/2020 | Liu |
| 2020/0341105 A1 | 10/2020 | Liu |
| 2020/0411539 A1 | 12/2020 | She et al. |
| 2021/0202457 A1* | 7/2021 | Choi ...................... H01L 24/05 |
| 2022/0045099 A1 | 2/2022 | She et al. |

FOREIGN PATENT DOCUMENTS

| | | |
|---|---|---|
| CN | 101770806 A | 7/2010 |
| CN | 102332298 A | 1/2012 |
| CN | 102939632 A | 2/2013 |
| CN | 102971798 A | 3/2013 |
| CN | 110520990 A | 11/2019 |
| EP | 1403878 A2 | 3/2004 |
| JP | 2013140667 A | 7/2013 |

OTHER PUBLICATIONS

International Search Report in International application No. PCT/CN2020/140098, mailed on Dec. 28, 2020.
Written Opinion of the International Search Authority in International application No. PCT/CN2020/140098, mailed on Dec. 28, 2020.

* cited by examiner

SEMICONDUCTOR DEVICES

CROSS-REFERENCE TO RELATED APPLICATIONS

This application is a continuation of International Application No. PCT/CN2020/140098, filed on Dec. 28, 2020, which claims priority to Chinese Patent Application No. 202011316312.5, filed on Nov. 13, 2020. The disclosures of the aforementioned applications are incorporated herein by reference in their entireties.

TECHNICAL FIELD

The present disclosure relates to semiconductor devices.

BACKGROUND

A semiconductor device, such as a three-dimensional memory, is typically formed by bonding an array substrate and a complementary metal oxide semiconductor (CMOS) wafer. In the related art, the array wafer includes a plurality of memory strings and a plurality of local bit lines (LBLs), and the CMOS wafer includes a plurality of global bit lines (GBLs) and a plurality of multiplexers for selecting one of the global bit lines and one of the local bit lines at a time to applying a signal to a corresponding one of the memory strings.

However, since both the global bit lines and the multiplexers are in the CMOS wafer, routing channels in the CMOS wafer are complicated, resulting in a high load of the global bit line.

SUMMARY

In view of the above, an embodiment of the present disclosure provides a semiconductor device. The semiconductor device includes:

a memory array structure including a plurality of memory strings, a plurality of local bit lines, and a plurality of global bit lines; and a peripheral structure on the memory array structure including a plurality of local bit line selectors and at least one global bit line selector, wherein each of the local bit lines is connected with at least one of the memory strings, an output terminal of each of the local bit line selectors is connected with more than one local bit lines of the local bit lines through first through holes, an input terminal of each of the local bit line selectors is connected with a corresponding one of the global bit lines through a second through hole, and an output terminal of each of the at least one global bit line selector is connected with more than one global bit lines of the global bit lines through third through holes.

DETAILED DESCRIPTION

The specific structural and functional details described herein are illustrative only for describing exemplary embodiments of the present disclosure. The present disclosure may be implemented in various alternative forms and should not be construed as being limited to the embodiments set forth herein.

In the description of the present disclosure, it should be understood that orientations or position relationships indicated by the terms "center", "lateral", "upper", "lower", "left", "right", "vertical", "horizontal", "top", "bottom", "inside", "outside", or the like are based on orientations or position relationships illustrated in the drawings. The terms are used to facilitate and simplify the description of the present disclosure, rather than indicate or imply that the devices or elements referred to herein are required to have specific orientations or be constructed or operate in the specific orientations. Accordingly, the terms should not be construed as limiting the present disclosure. In addition, the term "first", "second" are for illustrative purposes only and are not to be construed as indicating or imposing a relative importance or implicitly indicating the number of technical features indicated. Thus, a feature that limited by "first", "second" may expressly or implicitly include one or more of the features. In the description of the present disclosure, the meaning of "plural" is two or more, unless otherwise specifically defined. Furthermore, the terms "include/comprises" and "having", and any variation thereof, are intended to cover non-exclusive inclusion.

In the description of the present disclosure, it is to be noted that the terms "mount", "connected", and "coupled" are to be understood in a broad sense, unless otherwise expressly defined and limited, and may mean, for example, fixed, detachable, or integral connection; or may mean a mechanical connection or an electrical connection. It may mean direct connection or indirect connection via an intermediate medium, and it may mean internal communication of the two elements. The specific meaning of the above terms in the present disclosure may be understood by those of ordinary skill in the art.

The terminology used herein is for the purpose of describing specific embodiments only and is not intended to limit the exemplary embodiments. As used herein, the singular forms "a," "an," and "the" are also intended to include the plural unless the context clearly dictates otherwise. It should also be understood that the terms "including" and/or "comprising" as used herein specify the presence of the stated features, integers, steps, operations, units and/or components and do not exclude the presence or addition of one or more other features, integers, steps, operations, units, components and/or combinations thereof.

Figure 1:
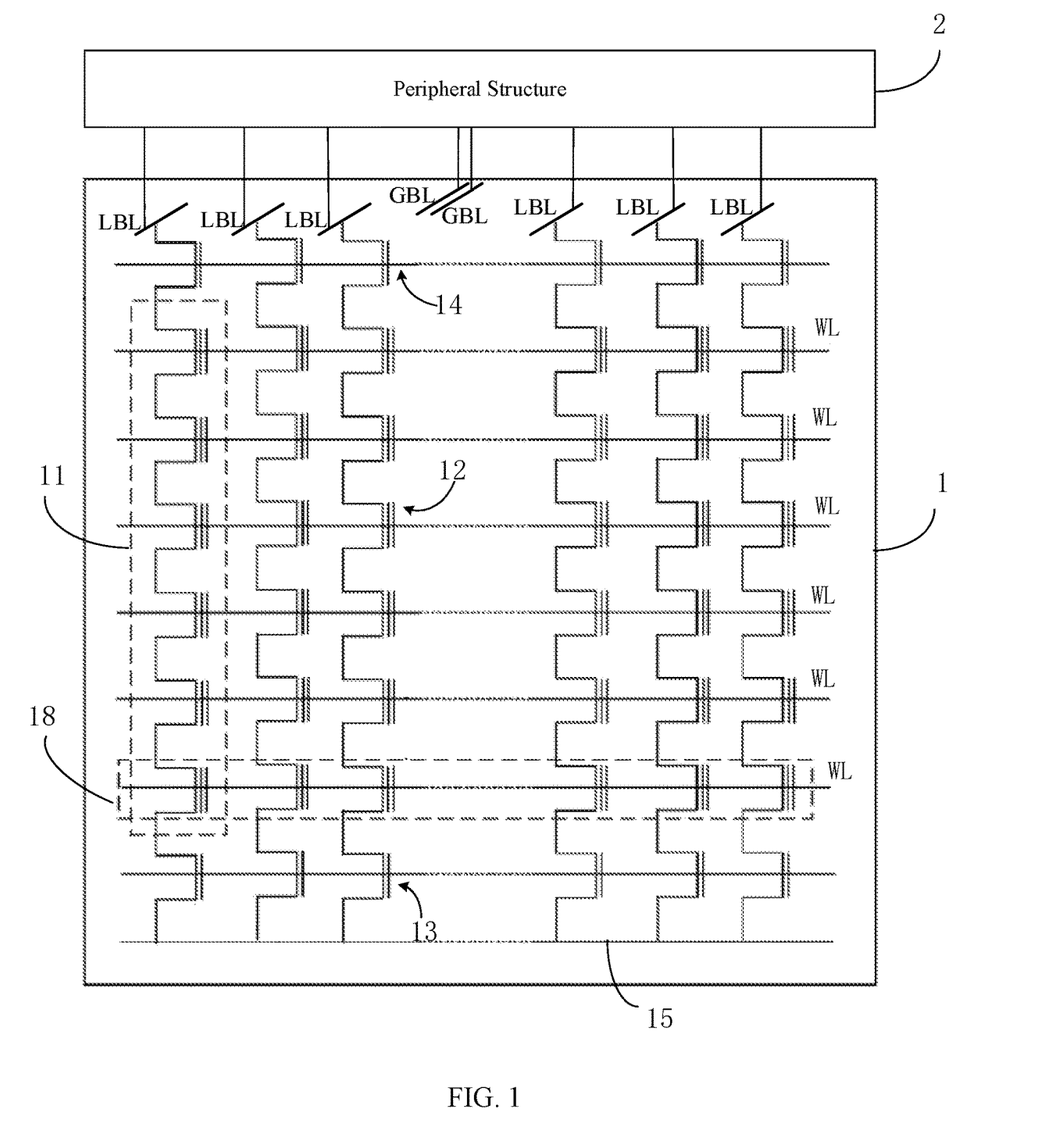
FIG. 1 is a schematic diagram of a circuit configuration of a semiconductor device according to an embodiment of the present disclosure.

FIG. 1 illustrates a schematic diagram of a circuit configuration of a semiconductor device according to an embodiment of the present disclosure.

As shown in FIG. 1, an embodiment of the present disclosure provides a semiconductor device including a memory array structure 1 and a peripheral structure 2. The peripheral structure 2 is located on the memory array structure 1, and the memory array structure 1 is bonded to the peripheral structure 2 to form a bonding structure. The memory array structure 1 may be anon-volatile memory array, such as NAND flash or NOR flash. The peripheral structure 2 may be a CMOS structure as a peripheral circuit of the memory array structure 1.

The memory array structure 1 and the peripheral structure 2 are disposed on chips in two different wafers, respectively, so that the memory array structure 1 and the peripheral structure 2 may be bonded together in a wafer-level bonding manner, thereby allowing the circuit structure of the memory array structure 1 may be combined with the circuit structure of the peripheral structure 2. The wafer-level bonding manner may be used for high-density encapsulating/interconnecting by using through silicon via (TSV) technology, hybrid bonding technology, or the like. The wafer-level bonding manner may further include bonding by using a reconstructed wafer, such as a chip-to-wafer bonding technique (a known good die (KGD) is directly bonding to a target wafer, to reconstruct a "new" wafer), and further performing a wafer-level bonding.

The memory array structure 1 includes a plurality of longitudinally extending memory strings 11. Each memory string 11 includes a plurality of memory cells 12 coupled in series. The memory cells 12 are stacked longitudinally, depending on design requirements and memory cell characteristics. Each memory cell 12 may be a "floating gate" type memory cell including a floating gate transistor, or may be a "charge trapping" type memory cell including a charge trapping transistor. Each memory string 11 may be coupled to a select gate source transistor 13 at a source terminal of the memory string 11 and coupled to a select gate drain transistor 14 at a drain terminal of the memory string 11. The select gate source transistor 13 and the select gate drain transistor 14 may be configured to activate the select memory string 11 during a read operation. In some embodiments, for example, the source selects transistors 13 of the memory strings 11 in the same memory block are coupled to ground through a same source line 15 (e.g., a common source line).

The memory array structure 1 further includes a word line WL through which the memory cells 12 of adjacent memory strings 11 are coupled. The word line WL selecting which row of memory cells 12 are affected by the read operation. In some embodiments, each word line WL is coupled to a memory page 18 of the memory cells 12, i.e., each word line WL is connected to a corresponding one of the memory pages 18.

Figure 2:
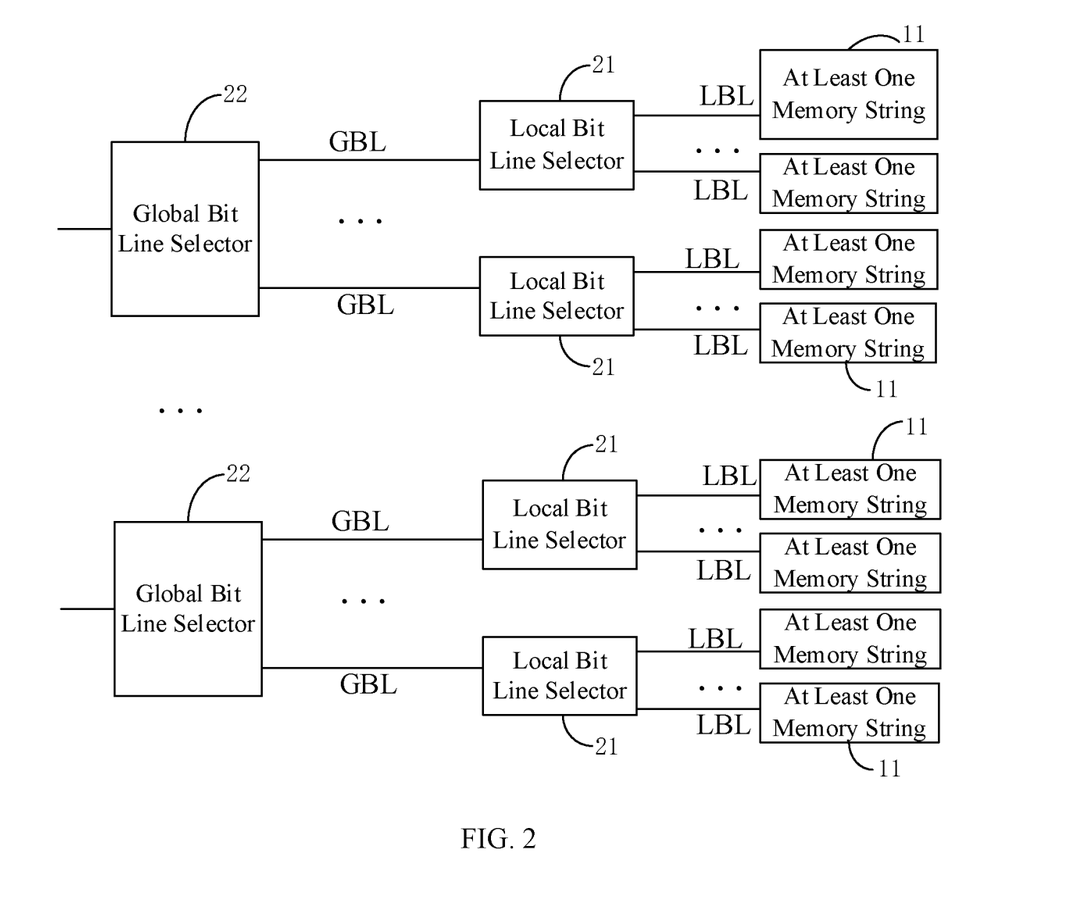
FIG. 2 is a schematic block diagram of a semiconductor device according to an embodiment of the present disclosure.

The memory array structure 1 further includes a plurality of local bit lines LBL located on a side of the memory string 11 adjacent to the peripheral structure 2. The select gate drain transistor 14 of each memory string 11 is coupled to one of local bit lines LBL corresponding to the memory string 11. Different memory strings 11 may be coupled to the same local bit lines LBL or to different local bit lines LBL, but each memory string 11 may only be coupled to a corresponding one of the local bit lines LBL. As shown in FIG. 2, each local bit line LBL is connected to at least one memory string 11 corresponding to the local bit line LBL.

Figure 3:
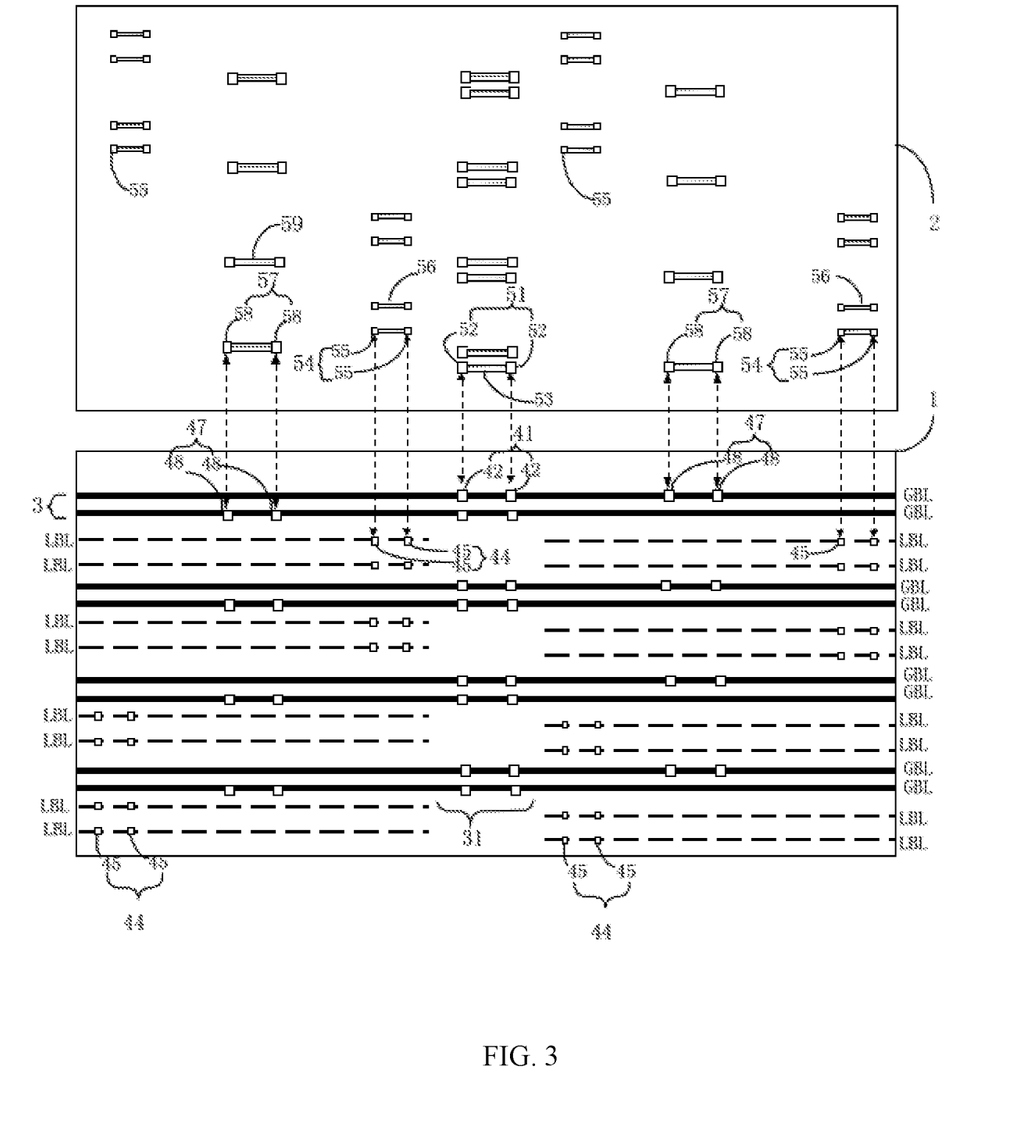
FIG. 3 is a schematic diagram of a structure of a semiconductor device according to an embodiment of the present disclosure.

The memory array structure 1 further includes a plurality of global bit lines GBL. Both the local bit lines LBL and the global bit lines GBL require higher line widths and spacing. Therefore, to avoid increasing a lateral width of the memory array structure 1, the global bit lines GBL and the local bit lines LBL are disposed at different layers. That is, the global bit lines GBL are located at a side of the local bit lines LBL close to the peripheral structure 2. Such an arrangement makes the local bit line LBL closer to the memory string, while the global bit line GBL becomes also closer to the local bit line LBL, so that the delay of the overall circuit is reduced. As shown in FIG. 3, the global bit lines GBL are parallel to and spaced apart from the local bit lines LBL.

Since both the global bit line GBL and the local bit line LBL require higher line widths and spacing, the global bit line GBL and the local bit line LBL are disposed at different metal layers. An orthographic projection of the global bit line GBL on the peripheral structure 2 and an orthographic projection of the local bit line LBL on the peripheral structure 2 may not coincide. Alternatively, the orthographic projections of the global bit line GBL and the local bit line LBL on the peripheral structure 2 may be partially overlapped as long as sufficient space for a vertical interconnect structure is provided in an un-overlaid portions of the local bit line LBL with the global bit line GBL, so that the local bit line LBL may be electrically connected to the peripheral structure 2 through the vertical interconnect structure.

In an embodiment, the orthogonal projection of the global bit line GBL on the peripheral structure 2 may be disposed adjacent to the orthogonal projection of the local bit line LBL on the peripheral structure 2. In a presented embodiment, the global bit line GBL is provided after the local bit line LBL is provided (the routing channel of the local bit line LBL may be kept unchanged), so that the orthographic projection of the global bit line GBL on a film layer in which the local bit line LBL is located is located in a gap between the local bit lines LBL. Thus, each of the global bit line GBL and the local bit line LBL may be electrically connected to the peripheral structure 2 through a vertical interconnect structure, and the global bit line selector and the local bit line selector in the memory array structure 1 may be arranged in order with each other.

Depending on a size of the gap between the local bit lines LBL, one or more global bit lines GBL may be provided in the gap between two adjacent local bit lines LBL, or no global bit lines GBL is provided in the gap, as long as the global bit lines GBL satisfy the required number and do not block the electrical connection of the local bit lines LBL to the peripheral structure 2 through the vertical interconnection structure.

As shown in FIG. 2, the peripheral structure 2 includes a plurality of local bit line selectors 21 and at least one global bit line selector 22. Both the local bit line selector 21 and the global bit line selector 22 may include multiplexers (MUX). Each local bit line LBL is connected to an output terminal of a corresponding local bit line selector 21 through a first through-hole, and different local bit lines LBL may be connected to the same or different local bit line selectors 21, under the premise that each local bit line LBL may be connected to a corresponding one of the local bit line selectors 21 (that is, an output terminal of each local bit line selector 21 is connected to a plurality of local bit lines LBL through the first through-holes). An input terminal of each local bit line selector 21 is connected to a corresponding one of the global bit lines GBL through the second through hole. That is, the number of the local bit line selectors 21 is the same as the number of the global bit lines GBL, and the input terminals of the local bit line selectors 21 are connected to the global bit lines GBL in one-to-one correspondence.

According to the type of the local bit line selector 21, local bit line groups are formed by different numbers of the local bit lines LBL. The position of the global bit line GBL may be disposed according to a position of the local bit line group. For example, if the local bit line selector 21 includes a four-way selector, every four local bit lines LBL constitute a local bit line group, and then correspond to a global bit line GBL. That is, each global bit line GBL is connected to four ones of the local bit lines LBL through a corresponding one of the local bit line selectors 21. Alternatively, if the local bit line selector 21 includes an eight-way selector, every eight local bit lines LBL constitute a local bit line group, and then correspond to a global bit line GBL. That is, each global bit line GBL is connected to eight ones of the local bit lines LBL through a corresponding one of the local bit line selectors 21.

Figure 4:
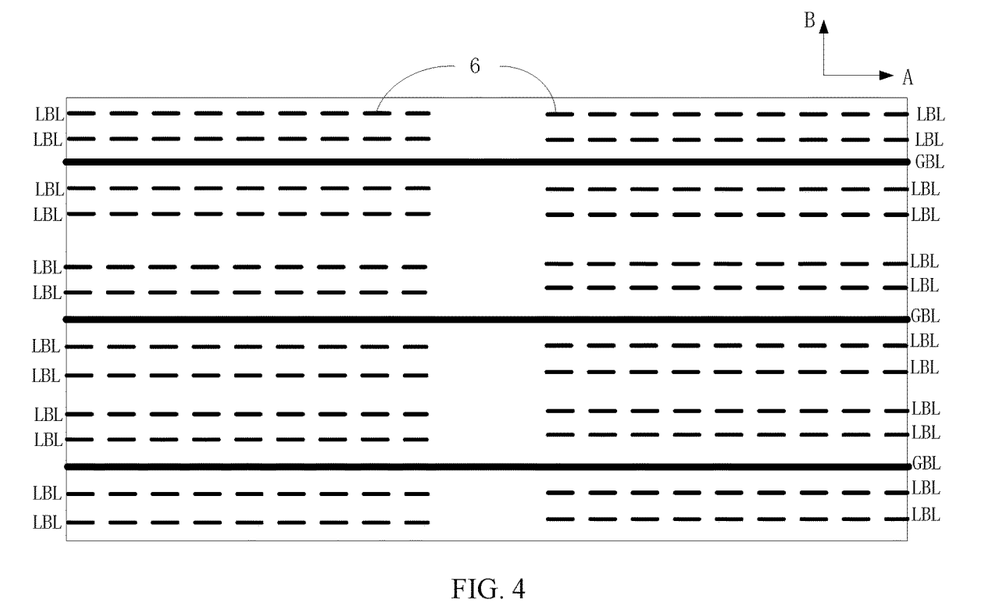
FIG. 4 is a schematic diagram showing position relationship between global bit lines and local bit lines in a semiconductor device according to an embodiment of the present disclosure.
Figure 5:
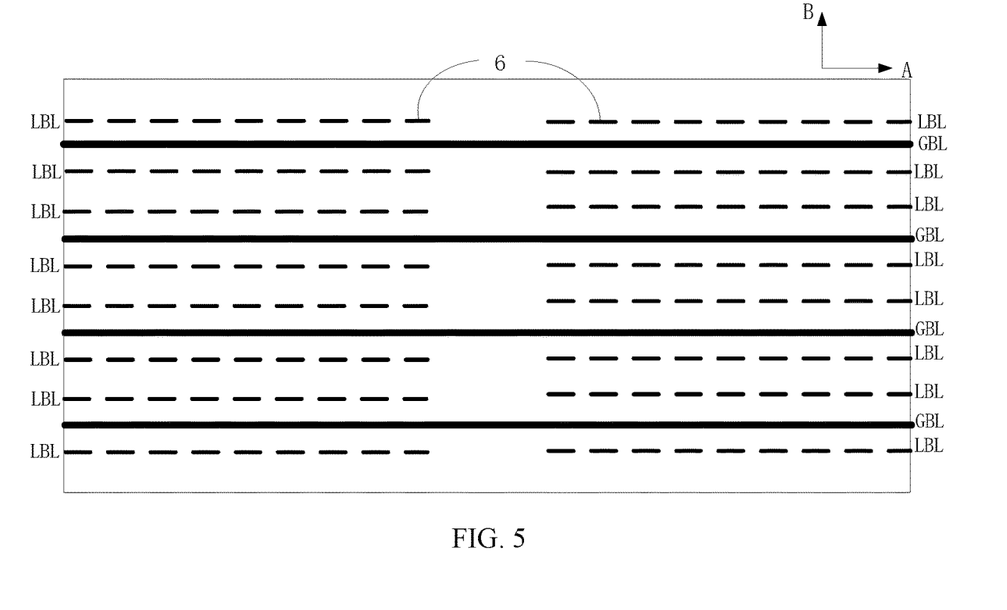
FIG. 5 is a schematic diagram showing position relationship between global bit lines and local bit lines in a semiconductor device according to another embodiment of the present disclosure.

In an embodiment, an orthogonal projection of the global bit line group on the peripheral structure 2 may be arranged symmetrically with respect to the orthogonal projection of the local bit line GBL on the peripheral structure 2. The number of the local bit lines LBL in the local bit line group is an even number. Each two local bit lines LBL in the local bit line group constitute a local bit line pair (such as local bit line pair 6 formed by a left local bit line LBL and a right local bit line LBL in a same row). The two local bit lines LBL in the local bit line pair are sequentially arranged in a first direction. An orthographic projection of the local bit line pair on the peripheral structure 2 and the orthographic projection of a corresponding one of the global bit lines GBL on the peripheral structure 2 are sequentially arranged in a second direction. The first direction is a direction along which the local bit line LBL extends, and the second direction is perpendicular to the first direction. For example, in the case that the local bit line group includes four local bit lines LBL, as shown in FIG. 5, orthographic projections of the four local bit lines LBL on the film layer in which the global bit lines GBL are located are symmetrically disposed on both sides of a corresponding one of the global bit lines GBL. Each of the both sides is disposed with two corresponding ones of the four local bit lines LBL. The two local bit lines LBL on each side constitute a local bit line pair 6. The two local bit lines LBL in the local bit line pair 6 are sequentially arranged in the first direction A. An orthographic projections of the local bit line pair 6 on the film layer in which the global bit lines GBL and the global bit line GBL are sequentially arranged along the second direction B. In the case that the local bit line group includes eight local bit lines LBL, as shown in FIG. 4, orthographic projections of the eight local bit lines LBL on the film layer in which the global bit lines GBL are located are symmetrically disposed on both sides of a corresponding one of the global bit lines GBL. Each of the both sides is disposed with four corresponding ones of the eight local bit lines LBL. Four local bit lines LBL on each side constitute a local bit line pair 6. The two local bit lines LBL in the local bit line pair 6 are sequentially arranged in the first direction A. Orthographic projections of two local bit line pair 6 at each side on the film layer in which the global bit lines GBL alternates with the global bit line GBL along the second direction B.

Each global bit line GBL is further connected to an output terminal of a corresponding one of the global bit line selectors 22 through a third through hole. In the case that the number of the global bit line selectors 22 is one, all the global bit lines GBL are connected to the output terminal of the global bit line selector 22. In the case that the number of the global bit line selectors 22 is multiple (two or more), different global bit lines GBL may be connected to a same bit line selector 22 or different global bit line selectors 22, under the premise that each global bit line GBL may be connected to a corresponding one of the global bit line selectors 22 (that is, the output terminal of each global bit line selector 22 is connected to the global bit lines GBL through the third through holes). The global bit line GBL and the global bit line selector 22 in the present embodiment are provided in different wafers, so that the connection position where the global bit line GBL is connected to the global bit line selector 22 may be arbitrarily stereotypically set, thereby simplifying the routing channel of the global bit lines GBL.

Since the output terminal of one global bit line selector 22 is connected to a plurality of global bit lines GBL, more than one global bit lines GBL may be provided at a gap between two adjacent local bit lines LBL. For example, the global bit lines GBL may be provided in pairs, that is, every two global bit lines GBL may constitute a global bit line pair 3. An orthographic projection of the global bit line pair 3 on the peripheral structure 2 may be provided adjacent to the orthographic projection of the local bit line LBL on the peripheral structure 2. Therefore, when the global bit lines GBL in the global bit line pair 3 is connected to the same global bit line selector 22, the connection line between the output terminal of the global bit line selector 22 and each of the global bit lines GBL in the global bit line pair 3 may be shortened, thereby saving routing space in the peripheral structure 2.

During operation of the semiconductor device, in response to a signal input to a global bit line selector 22, the global bit line selector 22 selects one global bit line GBL from a plurality of global bit lines GBL connected thereto, transmits the signal through this global bit line GBL to a local bit line selector 21 connected to this global bit line GBL. Then, this local bit line selector 21 selects one local bit line LBL from a plurality of local bit lines LBL connected thereto, and transmits a signal through this local bit line LBL to at least one memory string 11 connected to this local bit line LBL, to apply a signal to one or more memory cells 12 corresponding to the at least one memory string 11.

In addition, the peripheral structure 2 may further include any suitable digital, analog or mixed signal circuitry for facilitating operation of the semiconductor device. For example, the peripheral structure 2 may further include one or more of a data buffer (e.g., a bit line page buffer), a decoder (e.g., a row decoder or a column decoder), a sense amplifier, a charge pump, a current or voltage reference, or any active or passive component of a circuit (e.g., a transistor, a diode, a resistor, or a capacitor).

Further, a first insulation layer (not shown) is provided between the global bit line GBL and the local bit line LBL in the memory array structure 1. A second insulation layer (not shown) is further provided on the global bit line GBL. A third insulation layer (not shown) is further provided on a side of the local bit line selector 21 and the global bit line selector 22 in the peripheral structure 2 adjacent to the memory array structure 1. The global bit line GBL, the local bit line LBL, the local bit line selector 21, and the global bit line selector 22 may be connected to each other by through holes in the insulation layers. The memory array structure 1 is interconnected with the peripheral structure 2 by means of hybrid bonding.

As shown in FIG. 3, the local bit line LBL is provided with a third conductive through hole 44. That is, the third conductive through hole 44 passes longitudinally through the first insulation layer and the second insulation layer at a position corresponding to the local bit line LBL. The output terminal of the local bit line selector 21 is provided with a fourth conductive through hole 54 opposite to the third conductive through hole 44. That is, the fourth conductive through holes 54 passing longitudinally through the third insulation layer are disposed at the positions of the third insulation layer corresponding to the third via holes 44. In another word, the first through hole includes the third conductive through hole 44 and the fourth conductive through hole 54. The third conductive through hole 44 and the fourth conductive through hole 54 are filled with a conductive material, so that the local bit line LBL is electrically connected to the output terminal of a corresponding one of the local bit line selectors 21 via the third conductive through hole 44 and the fourth conductive through hole 54.

It should be noted that a plurality of fourth conductive through holes 54 may be provided at the output terminal of the local bit line selector 21, and the number of the fourth conductive through holes 54 is the same as the number of the local bit lines LBL connected to the local bit line selector 21. Each local bit line LBL is provided thereon with a third conductive through hole 44, so that the fourth conductive through holes 54 are arranged in one-to-one correspondence with the third conductive through holes 44 on the local bit lines LBL, and each local bit line LBL is connected to a corresponding one of the local bit line selectors 21 through the third conductive through holes 44 on the local bit line LBL and a corresponding fourth conductive through hole 54.

Here, the third conductive through hole 44 is located at a fixed position on the local bit line LBL, such as an edge position of the local bit line LBL. The fixed position may be a connection position where the existing local bit line LBL is connected to the local bit line selector 21. Therefore, a position relationship between the existing local bit line LBL and the local bit line selector 21 is kept unchanged, regardless of different designs of the global bit line GBL.

In addition, the orthographic projection of the global bit line GBL on the peripheral structure 2 may overlap with the orthographic projection of the local bit line LBL on the peripheral structure 2, but the orthographic projection of the global bit line GBL on the peripheral structure 2 does not overlap with an orthographic projection of the third conductive through hole 44 on the peripheral structure 2, so as to ensure that the local bit line LBL may be electrically connected to the peripheral structure 2 through the third conductive through hole 44. For example, the orthogonal projection of the global bit line 3 on the peripheral structure 2 may be disposed adjacent to the orthogonal projections of the third conductive through holes 44 on the peripheral structure 2.

Figure 6:
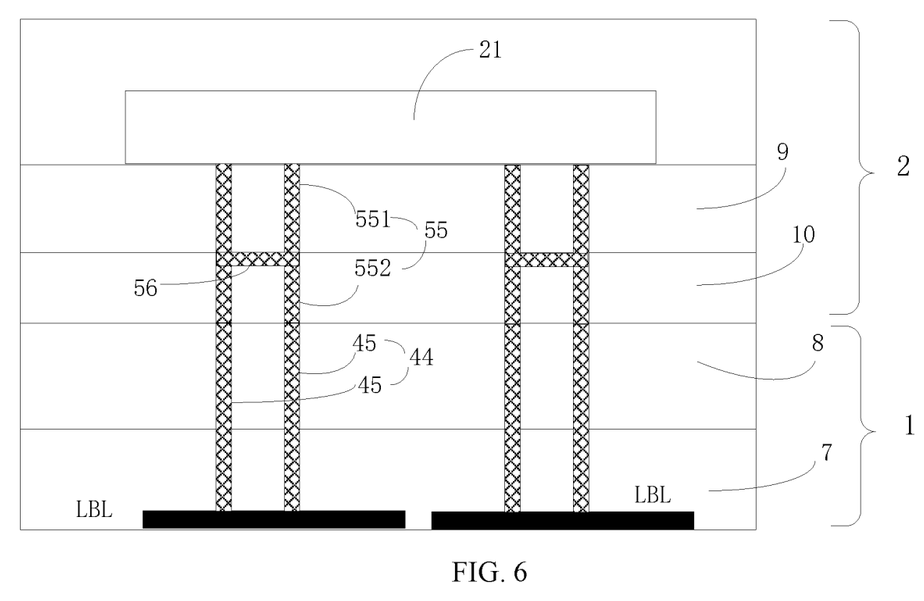
FIG. 6 is a schematic diagram showing connection relationship between local bit lines and a local bit line selector in a semiconductor device according to an embodiment of the present disclosure.

Further, as shown in FIG. 6, the third conductive through hole 44 includes a plurality of third connection holes 45, for example, two third connection holes 45. Each of the third connection holes 45 passes longitudinally through the first insulation layer 7 and the second insulation layer 8. The fourth conductive through hole 54 includes a plurality of fourth connection holes 55, for example, two fourth connection holes 55. Each of the fourth connection holes 55 passes through the third insulation layer 9 and the fourth insulation layer 10 (the fourth insulation layer 10 may be selectively omitted). The fourth connection holes 55 may also be connected to each other by metal lines 56. For example, the fourth connection hole 55 may include a first sub-hole 551 passing longitudinally through the third insulation layer 9 and filled with a conductive material, and a second sub-hole 552 passing through the fourth insulation layer 10 and filled with a conductive material. The metal line 56 may be formed between the third insulation layer 9 and the fourth insulation layer 10. Alternatively, the metal lines 56 may be formed in the fourth insulation layer 10, and the metal lines 56 may be located on the contact surfaces between the memory array structure 1 and the array structure 2. Alternatively, the metal lines 56 may further be located in the third insulation layer 9, and the two or more second sub-holes 552 are electrically connected via the metal lines 56. Due to the presence of the metal line 56, it is possible to prevent an increase in resistance or delay caused when one or more of the first sub-holes 551 and the second sub-holes 552 are in poor contact, thereby improving the process reliability.

The third connection holes 45 are arranged in one-to-one correspondence with the fourth connection holes 55. Each of the third connection holes 45 and the fourth connection holes 55 is filled with a conductive material, so that the local bit line LBL is connected to the output terminal of a corresponding one of the local bit line selectors 21 through the third connection holes 45 and the fourth connection holes 55. In addition, the conductive material in the fourth connection holes 55 is electrically connected to the metal line 56, to improve the connection reliability between the local bit line LBL and the local bit line selector 21.

Further, as shown in FIG. 3, a first conductive through hole 41 is disposed on the global bit line GBL. That is, the first conductive through hole 41 passing longitudinally through the second insulation layer is disposed at a position of the second insulation layer corresponding to the global bit line GBL. The output terminal of the global bit line selector 22 is provided with a second conductive through hole 51 opposite to the position of the first conductive through hole 41. That is, the second conductive through holes 51 passing longitudinally through the second insulation layer are disposed at the positions of the second insulation layer corresponding to the first conductive through holes 41. In another word, the third through hole includes the first conductive through hole 41 and the second conductive through hole 51. The first conductive through hole 41 and the second conductive through hole 51 are filled with a conductive material, so that the global bit line GBL is electrically connected to the output terminal of a corresponding one of the global bit line selectors 22 via the first conductive through hole 41 and the second conductive through hole 51.

It should be noted that a plurality of second conductive through holes 51 may be provided at the output terminal of the global bit line selector 22, and the number of the second conductive through holes 51 is the same as the number of the global bit lines GBL connected to the global bit line selector 22. Each global bit line GBL is provided thereon with a first conductive through hole 41, so that the second conductive through holes 51 are arranged in one-to-one correspondence with the first conductive through holes 41 on the global bit lines GBL, and each global bit line GBL is connected to a corresponding one of the global bit line selectors 22 through the first conductive through holes 41 on the global bit line LBL and a corresponding second conductive through hole 51.

The first conductive through hole 41 may be located at any position on the global bit line GBL corresponding to the position of the global bit line selector 22. That is, the first conductive through hole 41 is opposite to the global bit line GBL and the position of the global bit line selector 22, and the connection position (the position of the first conductive through hole 41) on the global bit line GBL may be changed, so that the global bit line selector 22 may be disposed at any desired position, thereby adjusting the position of the first conductive through hole 41 on the global bit line GBL according to the position of the global bit line selector 22. The global bit line GBL includes a middle section 31 located in a middle of the global bit line GBL and edge sections located on both sides of the middle section 31. The first conductive through hole 41 may be located on the middle section 31 of the global bit line GBL. That is, the first conductive through hole 41 corresponds to the position of the middle section 31 and the global bit line selector 22. In an embodiment, the connection position of the local bit line LBL to the local bit line selector 21 remains unchanged in the current design, but the orthogonal projection of the local bit line LBL on the film layer where the global bit line GBL is located is provided close to the edge section of the global bit line GBL. Therefore, the local bit line selector 21 is provided close to an edge of the peripheral structure 2, and thus a space is formed in the middle of the peripheral structure 2. The global bit line selector 22 is provided in the middle of the peripheral structure 2. That is, the global bit line selector 22 may be located in the middle of the orthogonal projection of the global bit line GBL on the peripheral structure 2. Therefore, the first conductive through hole 41 is provided at the middle section 31 of the global bit line GBL, so that the first conductive through hole 41 extends longitudinally, to electrically connect the global bit line GBL to the global bit line selector 22, thereby simplifying the routing channel of the global bit line GBL and reducing the load of the global bit line GBL. It should be noted that the connection position between the local bit line LBL and the local bit line selector 21 may be different from the current design, so that the position provided for the global bit line selector 22 in the peripheral structure 2 may be changed, and the position of the first conductive through hole 41 on the global bit line GBL may be changed, that is, not limited to the middle position.

Further, as shown in FIG. 3, the first conductive through hole 41 includes a plurality of first connection holes 42, for example, two first connection holes 42. Each of the first connection holes 42 passes longitudinally through the first insulation layer. The second conductive through hole 51 may include a plurality of second connection holes 52, for example, two second connection holes 52. The second connection holes 52 are interconnected by metal lines 53, which may be located at the same layer as the metal line 56. The structure of the second connection hole 52 is similar to that of the fourth connection hole 54, and details are not described herein. The first connection holes 42 are arranged in one-to-one correspondence with the second connection holes 52. Each of the first connection holes 42 and the second connection holes 52 is filled with a conductive material, so that the global bit line GBL is connected to the output terminal of a corresponding one of the global bit line selectors 22 through the first connection holes 42 and the second connection holes 52. In addition, the conductive material in the second connection holes 52 is electrically connected to the metal line 53, to improve the connection reliability between the global bit line GBL and the global bit line selector 22.

Further, as shown in FIG. 3, a fifth conductive through hole 47 is further disposed on the global bit line GBL. That is, the fifth conductive through hole 47 passing longitudinally through the second insulation layer is disposed at a position of the second insulation layer corresponding to the global bit line GBL. A sixth conductive through hole 57 opposite to the fifth conductive through hole may be provided at an input terminal of the global bit line selector 21. That is, the sixth conductive through holes 57 passing longitudinally through the third insulation layer are disposed at the positions of the third insulation layer corresponding to the fifth conductive through holes 47. In another word, the second through hole includes the fifth conductive through hole 47 and the sixth conductive through hole 57. The fifth conductive through hole 47 and the sixth conductive through hole 57 are filled with a conductive material, so that the global bit line GBL is electrically connected to the input terminal of a corresponding one of the local bit line selectors 21 via the fifth conductive through hole 47 and the sixth conductive through hole 57.

The fifth conductive through hole 47 may be located on any position on the global bit line GBL corresponding to the local bit line selectors 21.

The fifth conductive through hole 47 may include a plurality of fifth connection holes 48. Each of the fifth connection holes 48 passes longitudinally through the second insulation layer. The sixth through-hole 57 includes a plurality of sixth connection holes 58, and the sixth connection holes 58 are interconnected by metal lines 59. The metal line 59 may be located in the same layer as the metal line 53 and the metal line 56. The structure of the sixth connection holes 58 is similar to that of the fourth connection hole 54, and details are not described herein. The fifth connection holes 48 are arranged in one-to-one correspondence with the sixth connection holes 58. Each of the fifth connection holes 48 and the sixth connection holes 58 is filled with a conductive material, so that the global bit line GBL is connected to the input terminal of a corresponding one of the local bit line selectors 21 via the fifth connection holes 48 and the sixth connection holes 58. In addition, the conductive material in each of the fifth connection holes 48 and the sixth connection holes 58 is electrically connected to a corresponding one of the metal lines 59, to improve the connection reliability between the global bit line GBL and the local bit line selector 21.

Due to the arrangement of the stacked structure, a larger redundancy space may be used for the global bit line selector 22 and the local bit line selector 21 during the design of the peripheral structure of the chip. Therefore, the positions of the global bit line selector 22 and the local bit line selector 21 may be set correspondingly to the positions of the global bit line GBL and the local bit line LBL in the memory array structure 1. That is, the global bit line selector 22 and the local bit line selector 21 are provided over the projection positions of the global bit line GBL and the local bit line LBL, respectively. Due to this flexible arrangement, by means of the bonding structure, it is possible to make lengths of conductor lines between the bit line selector 22 and the local bit line selector 21 and the memory strings 11 as small as possible. For example, the global bit line selector 22 is disposed in the middle of the global bit line GBL, so that the total distance from the global bit line selector 22 to the local bit line selectors 21 connected in parallel thereafter is reduced (because the transmission distance of the signal transmitted through the global bit line is reduced). At the same time, since the position of the local bit line selector 21 with respect to the local bit line LBL is adjustable, there is a trade-off between the distance from the local bit line selector 21 to the global bit line GBL and the distance from the global bit line GBL to the memory string 11, and thus the position of the local bit line selector 21 with the minimum total distance may be set.

As can be seen from the above, in the semiconductor device according to an embodiment of the present disclosure, a plurality of memory strings, a plurality of local bit lines, and a plurality of global bit lines are provided in a memory array structure. A plurality of local bit line selectors and at least one global bit line selector are provided in a peripheral structure. Therefore, in a bonding structure formed by the memory array structure and the peripheral structure, the global bit line selectors and the local bit line selectors are positioned more flexibly, thereby simplifying a routing channel of the global bit lines in the semiconductor device and further reducing a load of the global bit lines. The global bit line selector and the local bit line selector may be arranged at any position corresponding to the global bit line and the local bit line, by a vertical interconnect structure (for example, through silicon via (TSV) technology, a hybrid bond, a bump structure). For example, in the case that the global bit line selector is arranged in the middle of the projection of the global bit line, the overall distance between the global bit line selector and the memory string may be reduced, thereby not only making the layout design more flexible, but also making the response speed of the memory enhanced.

Some embodiments of the present disclosure have been described above, but not intended to limit the present disclosure. Those skilled in the art may make various changes and modifications without departing from the spirit and scope of the present disclosure. Therefore, the scope of the present disclosure is defined by the claims.

What is claimed is:

1. A semiconductor device comprising:
   a memory array structure comprising a plurality of memory strings, a plurality of local bit lines, and a plurality of global bit lines; and
   a peripheral structure on the memory array structure, comprising a plurality of local bit line selectors and one or more global bit line selectors,
   wherein each of the local bit lines is connected with at least one of the memory strings;
   each of the local bit line selectors has an output terminal connected with ones of the local bit lines respectively through first through holes, and an input terminal connected with one of the global bit lines through a second through hole; and
   each of the global bit line selectors has an output terminal connected with ones of the global bit lines respectively through third through holes.

2. The semiconductor device of claim 1, wherein the local bit lines are located on a side of the memory strings close to the peripheral structure, and the global bit lines are located on a side of the local bit lines close to the peripheral structure.

3. The semiconductor device of claim 1, wherein each of the third through holes comprises a first conductive through hole disposed on one of the global bit lines and a second conductive through hole disposed at the output terminal of one of the global bit line selectors, the first conductive through hole being opposite to and electrically connected with the second conductive through hole.

4. The semiconductor device of claim 3, wherein an orthographic projection of the first conductive through hole on the peripheral structure is covered by one of the global bit line selectors corresponding to the first conductive through hole.

5. The semiconductor device of claim 4, wherein the first conductive through hole is located on a middle of one of the global bit lines corresponding to the first conductive through hole.

6. The semiconductor device of claim 3, wherein the first conductive through hole comprises a plurality of first connection holes, the second conductive through hole comprises a plurality of second connection holes interconnected by a metal line, and the first connection holes respectively correspond to the second connection holes, and
   each of the global bit lines is connected with the output terminal of one of the global bit line selectors via the first connection holes and the second connection holes.

7. The semiconductor device of claim 1, wherein each of the first through holes comprises a third conductive through hole disposed on one of the local bit lines and a fourth conductive through hole disposed at the output terminal of one of the local bit line selectors, the third conductive through hole being opposite to and electrically connected with the fourth conductive through hole, and
   each of the local bit lines is connected with the output terminal of one of the local bit line selectors via the third conductive through hole and the fourth conductive through hole.

8. The semiconductor device of claim 7, wherein the third conductive through hole comprises a plurality of third connection holes, the fourth conductive through hole comprises a plurality of fourth connection holes interconnected by a metal line, and the third connection holes respectively correspond to the fourth connection holes, and
   each of the local bit lines is connected with the output terminal of one of the local bit line selectors via the third connection holes and the fourth connection holes.

9. The semiconductor device of claim 7, wherein each of the local bit lines is disposed parallel to each of the global bit lines, and an orthographic projection of the third conductive through hole on the peripheral structure does not overlap an orthographic projection of each of the global bit lines on the peripheral structure.

10. The semiconductor device of claim 9, wherein every two adjacent ones of the global bit lines constitute a global bit line pair, and an orthogonal projection of the global bit line pair on the peripheral structure is adjacent to the orthogonal projection of the third conductive through hole, disposed on one of the local bit lines close to the global bit line pair, on the peripheral structure.

11. The semiconductor device of claim 9, wherein every preset number of adjacent ones of the local bit lines constitute a local bit line group corresponding to one of the global bit lines, and an orthographic projection of the local bit line group on the peripheral structure is symmetrical with respect to the orthographic projection of one of the global bit lines, corresponding to the local bit line group, on the peripheral structure.

12. The semiconductor device of claim 11, wherein every two local bit lines of the local bit line group that are sequentially arranged in a first direction, in which each of the local bit lines extends, constitute one of a plurality of local bit line pairs, so that the local bit line group comprises the local bit line pairs,
   respective orthographic projections of the local bit line pairs on the peripheral structure and the orthographic projection of one of the global bit lines, corresponding to the local bit line group, on the peripheral structure are sequentially arranged in a second direction perpendicular to the first direction, and
   each of the global bit lines is adjacent to two ones of the local bit line pairs corresponding to the each of the global bit lines in the second direction.

13. The semiconductor device of claim 2, wherein each of the local bit lines is disposed parallel to each of the global bit lines, and an orthographic projection of each of the local bit lines on the peripheral structure partially overlaps or does not overlap an orthographic projection of any of the global bit lines on the peripheral structure.

14. The semiconductor device of claim 1, wherein the second through hole comprises a fifth conductive through hole disposed on one of the global bit lines and a sixth conductive through hole disposed at the input terminal of one of the local bit line selectors, the fifth conductive through hole being opposite to and electrically connected with the sixth conductive through hole, and each of the global bit lines is connected with the input terminal of one of the local bit line selectors via the fifth conductive through hole and the sixth conductive through hole.

15. The semiconductor device of claim 14, wherein the fifth conductive through hole comprises a plurality of fifth connection holes, the sixth conductive through hole comprises a plurality of sixth connection holes interconnected by a metal lines, and the fifth connection holes respectively correspond to the sixth connection holes, and each of the global bit lines is connected to the input terminal of one of the local bit line selectors via the fifth connection holes and the sixth connection holes.

16. The semiconductor device of claim 12, wherein the local bit line group comprises two local bit line pairs that are located respectively on both sides of one of the global bit lines corresponding to the local bit line group.

17. The semiconductor device of claim 12, wherein the local bit line group comprises four local bit line pairs, and two ones of the four local bit line pairs are located on each of both sides of one of the global bit lines corresponding to the local bit line group.

18. The semiconductor device of claim 7, wherein the third conductive through hole is located at an edge of one of the local bit lines.

19. The semiconductor device of claim 1, wherein each of the global bit line selectors is located at a middle of an orthographic projection of one of the global bit lines, connected with the each of the global bit line selectors, on the peripheral structure.

20. The semiconductor device of claim 6, wherein the plurality of second connection holes comprise two second connection holes interconnected by the metal line.

* * * * *